United States Patent
Fujii

(10) Patent No.: US 9,093,968 B2
(45) Date of Patent: Jul. 28, 2015

(54) SOUND REPRODUCING APPARATUS, SOUND REPRODUCING METHOD, AND RECORDING MEDIUM

(75) Inventor: Osamu Fujii, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 866 days.

(21) Appl. No.: 13/375,154

(22) PCT Filed: May 27, 2010

(86) PCT No.: PCT/JP2010/058994
§ 371 (c)(1),
(2), (4) Date: Jan. 6, 2012

(87) PCT Pub. No.: WO2010/137650
PCT Pub. Date: Dec. 2, 2010

(65) Prior Publication Data
US 2012/0128178 A1    May 24, 2012

(30) Foreign Application Priority Data
May 29, 2009    (JP) ................................ 2009-131318

(51) Int. Cl.
*H03G 5/00*    (2006.01)
*H03G 9/02*    (2006.01)
(Continued)

(52) U.S. Cl.
CPC ................ *H03G 9/025* (2013.01); *G10L 21/02* (2013.01); *H03G 9/005* (2013.01); *H04R 25/50* (2013.01);
(Continued)

(58) Field of Classification Search
USPC ......... 381/1, 17, 27, 56–59, 71.11, 71.14, 74, 381/98, 101, 102, 104, 106, 107, 306; 709/224, 228
See application file for complete search history.

(56) References Cited

U.S. PATENT DOCUMENTS 6,807,574 B1* 10/2004 Partovi et al. ................. 709/224
2001/0016048 A1* 8/2001 Rapeli ........................... 381/106
(Continued)

FOREIGN PATENT DOCUMENTS

JP    11-113097 A    4/1999
JP    11-261356 A    9/1999
(Continued)

OTHER PUBLICATIONS

International Search Report for International Patent Application No. PCT/JP2010/058994; mailed on Jun. 22, 2010.
(Continued)

*Primary Examiner* — Vivian Chin
*Assistant Examiner* — Friedrich W Fahnert
(74) *Attorney, Agent, or Firm* — Birch, Stewart, Kolasch & Birch, LLP

(57) ABSTRACT

Sound reproduction is controlled so as to be heard in the optimal state for the hearing function specific to elderly people. A frequency characteristic setting portion for setting the frequency characteristics of an inputted sound signal, and a sound volume setting portion for variable controlling the volume is disclosed. The frequency characteristic setting portion changes a frequency characteristic in which a sound band including a human voice band is emphasized to a frequency characteristic in which the characteristics of a gain in accordance with a frequency gradually becomes flat with an increase in the volume set by the sound volume setting portion. As a result, the frequency band of the human voice is strongly emphasized so as to help elderly people hear it at a low volume, and, as the volume grows higher, a frequency characteristic is changed to a flatter frequency characteristic, thereby making it possible to output easy-to-hear sound while reducing inconvenience caused by the emphasis of a specific frequency band.

8 Claims, 13 Drawing Sheets

(51) Int. Cl.
  *G10L 21/02* (2013.01)
  *H03G 9/00* (2006.01)
  *H04R 25/00* (2006.01)
  *H04S 7/00* (2006.01)
  *G10L 21/0264* (2013.01)

(52) U.S. Cl.
  CPC .............. *H04S 7/30* (2013.01); *G10L 21/0264* (2013.01); *H04R 2225/43* (2013.01); *H04R 2430/03* (2013.01); *H04S 7/40* (2013.01); *H04S 2400/13* (2013.01); *H04S 2420/07* (2013.01)

(56) References Cited

U.S. PATENT DOCUMENTS

2004/0057586 A1* 3/2004 Licht ........................ 381/94.7
2004/0136540 A1* 7/2004 Iwasaki et al. ............. 381/59
2010/0222904 A1* 9/2010 Yamashita et al. ......... 700/94
2010/0296662 A1* 11/2010 Tanaka ....................... 381/63
2011/0115987 A1* 5/2011 Kubo .......................... 348/738

FOREIGN PATENT DOCUMENTS

| JP | 2001-95082 A | 4/2001 |
| JP | 3198558 B2 | 8/2001 |
| JP | 2003-230071 A | 8/2003 |
| JP | 2005-86462 A | 3/2005 |

OTHER PUBLICATIONS

Japanese Written Opinion for International Patent Application No. PCT/JP2010/058994; mailed on Jun. 22, 2010.

* cited by examiner

a1-b2 COEFFICIENT TABLE  22

| REPRODUCING APPARATUS MAXIMUM OUTPUT | SOUND VOLUME | COEFFICIENT a1···b2 |
|---|---|---|
| 1 | 1<br>2<br>:<br>:<br>60 | 0.9···0.6<br>0.8···2.5<br>:<br>:<br>0.1···0.9 |
| 2 | :<br>: | :<br>: |
| :<br>: | :<br>: | :<br>: |

(B)

a1-b2 COEFFICIENT TABLE  24

| REPRODUCING APPARATUS MAXIMUM OUTPUT | SOUND VOLUME | COEFFICIENT a1···b2 |
|---|---|---|
| 1 | 1<br>2<br>:<br>:<br>60 | 0.6···0.8<br>0.7···0.9<br>:<br>:<br>0.9···0.2 |
| 2 | :<br>: | :<br>: |
| :<br>: | :<br>: | :<br>: |

(A)

(B)

|     | 1 | 2 | 3 |
|-----|---|---|---|
| b0  | 0.985153556 | 2.067215636 | 0.521884767 |
| b1  | −1.970307113 | −0.871583816 | −0.094370722 |
| b2  | 0.985153556 | −0.783210245 | 0.201117419 |
| a0  | 1 | 1 | 1 |
| a1  | −1.970091029 | −0.871583816 | −0.094370722 |
| a2  | 0.970523197 | 0.284005391 | −0.276997814 |

DRC THRESHOLD VALUE TABLE       35

| REPRODUCING APPARATUS MAXIMUM OUTPUT | SOUND VOLUME | THRESHOLD VALUE |
|---|---|---|
| 1 | 1<br>2<br>⋮<br>60 | −5dB<br>−6dB<br>⋮<br>−28dB |
| 2 | ⋮ | ⋮ |
| ⋮ | ⋮ | ⋮ |

(B)

GAIN TABLE       36

| REPRODUCING APPARATUS MAXIMUM OUTPUT | SOUND VOLUME | GAIN |
|---|---|---|
| 1 | 1<br>2<br>⋮<br>60 | 1.5<br>1.4<br>⋮<br>1.0 |
| 2 | ⋮ | ⋮ |
| ⋮ | ⋮ | ⋮ |

FIG. 12
(A)
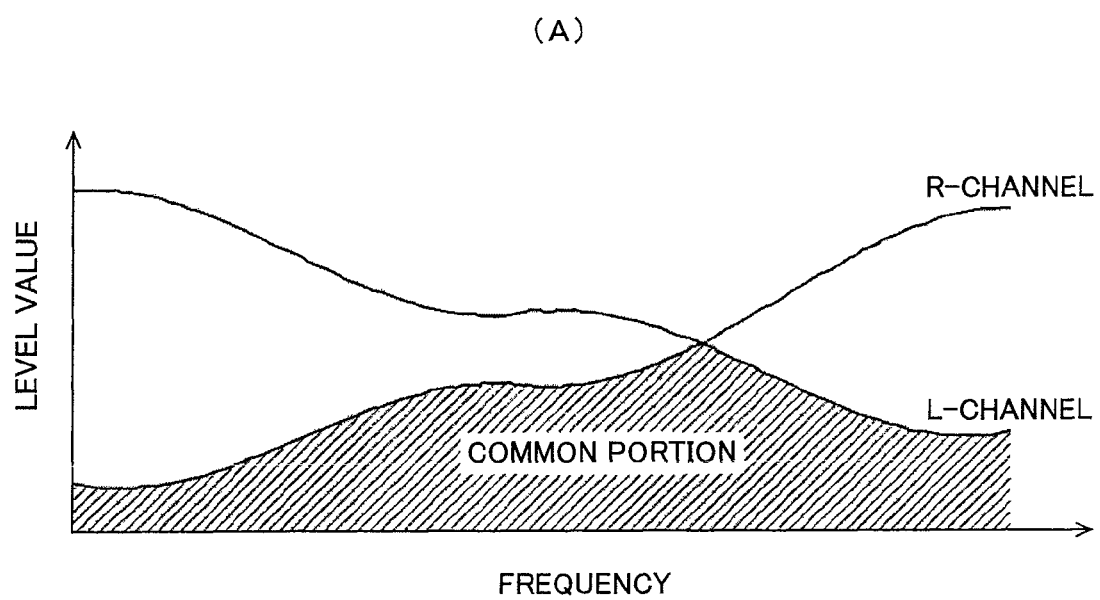
(B)
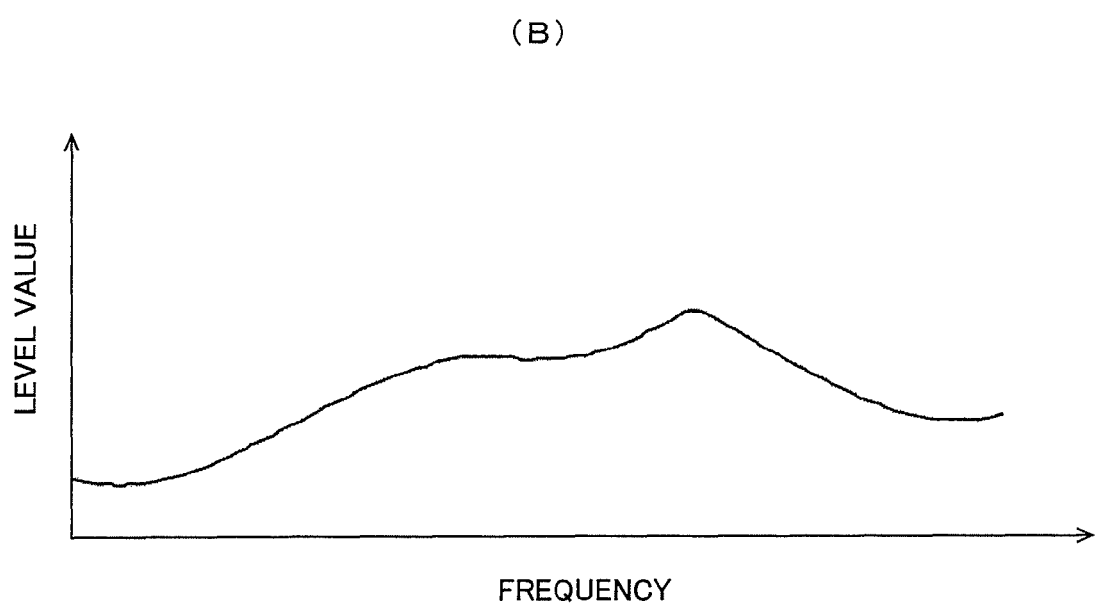

GAIN TABLE 52

| REPRODUCING APPARATUS MAXIMUM OUTPUT | SOUND VOLUME | MULTIPLYING PORTION(1) | MULTIPLYING PORTION(2) | MULTIPLYING PORTION(3) |
|---|---|---|---|---|
| 1 | 1 | 0.7 | 1.5 | 0.7 |
|  | 2 | 0.8 | 1.1 | 0.8 |
|  | ⋮ | ⋮ | ⋮ | ⋮ |
|  | 60 | 1.0 | 1.0 | 1.0 |
| 2 | ⋮ | ⋮ | ⋮ | ⋮ |

SOUND REPRODUCING APPARATUS, SOUND REPRODUCING METHOD, AND RECORDING MEDIUM

TECHNICAL FIELD

The present invention relates to a sound reproducing apparatus, a sound reproducing method, and a recording medium and particularly to a sound reproducing apparatus that executes a process of optimizing characteristics of output sound so as to make the output sound easily heard and prevent a feeling of annoyance when sounds of broadcast wave, recorded contents, etc., are reproduced, a sound reproducing method, and a computer-readable medium storing a program for implementing the function of the sound reproducing apparatus.

BACKGROUND ART

When television broadcast and recorded video/audio contents are watched/listened to, an apparatus is used that reproduces sound of these contents. A sound reproducing apparatus is applied to apparatuses etc., having an ability of the sound reproducing apparatus such as television, audio equipment, and PC, for example, and has a function of inputting sound signals of broadcast wave and recorded audio/video contents to output sound from speakers included in these apparatuses or externally connected.

When a user listens to reproduced sound by using such a sound reproducing apparatus, the user normally adjust a sound volume to listen to the sound in accordance with user's preference or necessity. For example, when an elderly person listens to reproduced sound, small sound is difficult to hear due to the weakened auditory function, etc., specific to elderly persons. Since such an elderly person is difficult to hear human voices such as words and vocals included in the reproduced sound as compared to younger persons, it is preferred to provide control so as to emphasize a frequency range including human voice as sound characteristic control for elderly persons.

In this case, if it is attempted to increase a sound volume to accurately hear human voices, noises and sound effects are also increased other than human voices and, therefore, the human voices do not necessarily become easier to hear. If a sound volume is increased, sound may be felt too loud and cause annoyance due to changes in the auditory function specific to elderly persons, as compared to younger persons.

FIG. 14 is a diagram of a state of deterioration in hearing due to aging depicted in a modeled manner. As depicted in FIG. 14, in general, the human auditory function gradually weakens with age and sound of a smaller sound volume becomes difficult to hear. Hearing particularly becomes worse in higher frequency bands, and sounds in higher frequency bands are more difficult to hear than that in lower frequency bands.

Elderly persons feel loud sound louder than younger persons due to an over recruitment phenomenon and may feel annoyance. FIG. 15 is a diagram of an example of how sound is heard due to the over recruitment phenomenon depicted in a modeled manner. As depicted in FIG. 15, in the case of elderly persons, for example, audible sound pressure abruptly rises after exceeding 60 dBSPL, and sound becomes audible at the level of sound pressure same as normal persons (e.g., younger persons) in about 80 dBSPL. After exceeding 80 dBSPL, elderly persons feel sound louder than normal persons. Therefore, such a phenomenon is observed that loud sound is heard louder while small sound is difficult to hear. Although it depends on an individual, such a phenomenon is specific to elderly persons.

Therefore, elderly persons have a problem that human voices such as vocals and words cannot clearly be recognized because sound is difficult to hear at a smaller sound volume and elderly persons also have a problem that a larger sound volume is felt louder than younger persons and adversely causes annoyance even if control is provided to emphasize human voices at a smaller sound volume because how sound is heard changes depending on sound volume.

Therefore, for broadcast wave and contents being reproduced, sound (human voice) must be emphasized to suppress noise and music depending on the situation and, even if a sound volume is increased or decreased on this occasion, output sound characteristics must optimally be controlled to prevent the feeling of annoyance.

For example, Patent Document 1 discloses a vocal sound band emphasis circuit that emphasizes vocal/word such that the vocal/word is clearly heard during a small sound volume and that appropriately emphasizes vocal/word while maintaining a balance of original sound during a medium sound volume or larger. The vocal sound band emphasis circuit includes an in-phase component extracting circuit taking out an in-phase component A from both L/R channel signals, a band pass filter extracting a vocal sound band B from the in-phase component A, a notch filter absorbing and attenuating a prescribed frequency component C from the vocal sound band B, an automatic level control circuit (ALC) amplifying an output signal D and outputting an output signal E, a microcomputer controlling an amplification level, and first and second synthesis circuits synthesizing the output signal E and input L/R channels and outputting them as vocal sound band emphasis L/R channel signals Lout and Rout. The microcomputer determines a signal level and/or a setting volume value of an original audio signal and controls the amplification level of the automatic level control circuit in a substantially inverse proportion relation.

PRIOR ART DOCUMENT

Patent Document

Patent Document 1: Japanese Laid-Open Patent Publication No. 2005-86462

SUMMARY OF THE INVENTION

Problem to be Solved by the Invention

To deal with the characteristics of the auditory function specific to elderly persons and enable elderly persons to comfortably listen to reproduced sound, sound (human voice) must be emphasized to suppress noise and music depending on the situation and, even if a sound volume is increased or decreased on this occasion, output sound characteristics must optimally be controlled to prevent the feeling of annoyance.

Patent Document 1 discloses a general control method of automatic level control (ALC) and discloses no technical concept of optimizing sound characteristics for eliminating difficulty in hearing and annoyance due to deterioration in the auditory function of elderly persons.

The present invention was conceived in view of the situations and it is therefore an object of the present invention to provide a sound reproducing apparatus, a sound reproducing method, and a program capable of providing control such that sound is heard in an appropriate state for the auditory function specific to elderly persons when sound is reproduced.

Means for Solving Problem

To solve the problems, a first technical means of the present invention is a sound reproducing apparatus comprising: a frequency characteristic setting portion that sets frequency characteristics of an input sound signal; and a sound volume setting portion that variably controls a sound volume when a sound signal is output as sound, wherein the frequency characteristic setting portion emphases a sound band including a band of human voice or attenuating bands other than the sound band, and the sound volume setting portion compresses a dynamic range.

A second technical means is a sound reproducing apparatus comprising: a frequency characteristic setting portion that sets frequency characteristics of an input sound signal; and a sound volume setting portion that variably controls a sound volume when a sound signal is output as sound, wherein the frequency characteristic setting portion makes a change from frequency characteristics with a sound band including a band of human voice emphasized to frequency characteristics with gain characteristics corresponding to frequency gradually flattened in accordance with increase in the sound volume set by the sound volume setting portion.

A third technical means is the sound reproducing apparatus of the second technical means, wherein the sound band is a range from about 1 kHz to 8 kHz.

A fourth technical means is the sound reproducing apparatus of the second technical means, comprising a listener selecting portion that selects whether a listener is an elderly person or a younger person depending on a user operation, wherein if the elderly person is selected, the frequency characteristics are changed in accordance with increase in the sound volume set by the sound volume setting portion.

A fifth technical means is a sound reproducing apparatus comprising: a dynamic range setting portion that sets a dynamic range of an input sound signal; and a sound volume setting portion that variably controls a sound volume when a sound signal is output as sound, wherein the dynamic range setting portion makes a change so as to gradually increase a compression rate of the dynamic range in accordance with increase in the sound volume set by the sound volume setting portion.

A sixth technical means is the sound reproducing apparatus of the fifth technical means, comprising a listener selecting portion that selects whether a listener is an elderly person or a younger person depending on a user operation, wherein if the elderly person is selected, the compression rate of the dynamic range is changed in accordance with increase in the sound volume set by the sound volume setting portion.

A seventh technical means is a sound reproducing apparatus comprising: a portion for extracting a common component from a plurality of sound signals respectively corresponding to a plurality of channels; a portion for subtracting the common component from each of the plurality of sound signals to extract a component other than the common component; a portion for changing gains of the extracted common component and the components other than the common component to mix the components; and a sound volume setting portion for variably controlling a sound volume when a sound signal is output as sound, wherein the sound reproducing apparatus reduces the gain of the common component in accordance with increase in the sound volume set by the sound volume setting portion.

An eighth technical means is the sound reproducing apparatus of the seventh technical means, comprising a listener selecting portion that selects whether a listener is an elderly person or a younger person depending on a user operation, wherein if the elderly person is selected, a mixture proportion and a gain is changed in accordance with increase in the sound volume set by the sound volume setting portion, in accordance with increase in the sound volume set by the sound volume setting portion.

A ninth technical means is a sound reproducing method executed by a sound reproducing apparatus that sets frequency characteristics of an input sound signal, the sound reproducing apparatus variably controlling a sound volume when a sound signal is output as sound, the method comprising the step of: emphasizing a sound band including a band of human voice or attenuating bands other than the sound band, and compressing a dynamic range by the sound reproducing apparatus.

A tenth technical means is a sound reproducing method executed by a sound reproducing apparatus that sets frequency characteristics of an input sound signal, and variably controls a sound volume when a sound signal is output as sound, wherein the method has a step that the sound reproducing apparatus from frequency characteristics with a sound band including a band of human voice emphasized to frequency characteristics with gain characteristics corresponding to frequency gradually flattened in accordance with increase in the sound volume set at the time of sound output.

An eleventh technical means is a sound reproducing method executed by a sound reproducing apparatus that sets a dynamic range of an input sound signal, and variably controls a sound volume when a sound signal is output as sound, wherein the method has a step that the sound reproducing apparatus changes a compression rate of the dynamic range so as to gradually increase the compression rate in accordance with increase in the sound volume set at the time of sound output.

A twelfth technical means is a sound reproducing method executed by a sound reproducing apparatus that extracts a common component from a plurality of sound signals respectively corresponding to a plurality of channels, subtracts the common component from each of the plurality of sound signals to extract a component other than the common component, changes gains of the extracted common component and the components other than the common component to mix the components, and variably controls a sound volume when a sound signal is output as sound, wherein the method has a step that the sound reproducing apparatus reduces the gain of the common component in accordance with increase in the set sound volume.

A thirteenth technical means is a computer-readable non-transitory medium storing a program for implementing the functions of the sound reproducing apparatus as defined in any one of the first to the eighth technical means by a computer.

Effect of the Invention

The present invention enables the provision of the sound reproducing apparatus, the sound reproducing method, and the recording medium capable of providing control such that sound is heard in an appropriate state for the auditory function specific to elderly persons when sound is reproduced.

BRIEF DESCRIPTION OF DRAWINGS

FIG. 2 is a diagram of a setting example of coefficient a1-b2 coefficient tables of FIG. 1.

FIG. 9 is a diagram of setting examples of a DRC threshold value table and a gain table of FIG. 7.

FIG. 12 is a diagram for explaining a common component in the configuration of FIG. 10.

MODES FOR CARRYING OUT THE INVENTION

[First Embodiment]

A first embodiment of a sound reproducing apparatus according to the present invention is characterized in that the sound reproducing apparatus reproducing an input sound signal to output sound emphasizes a frequency of a sound band corresponding to human voice with an equalizer when a sound volume of the sound output is relatively small while the frequency band of the output sound is gradually changed and flattened (flattened in the frequency direction) as the sound volume of the sound reproducing apparatus increases. Therefore, in this embodiment, the equalizer changing the frequency characteristics of an input sound signal is used for changing the frequency characteristics of a sound signal with the equalizer depending on a sound volume of the sound output.

Figure 1:
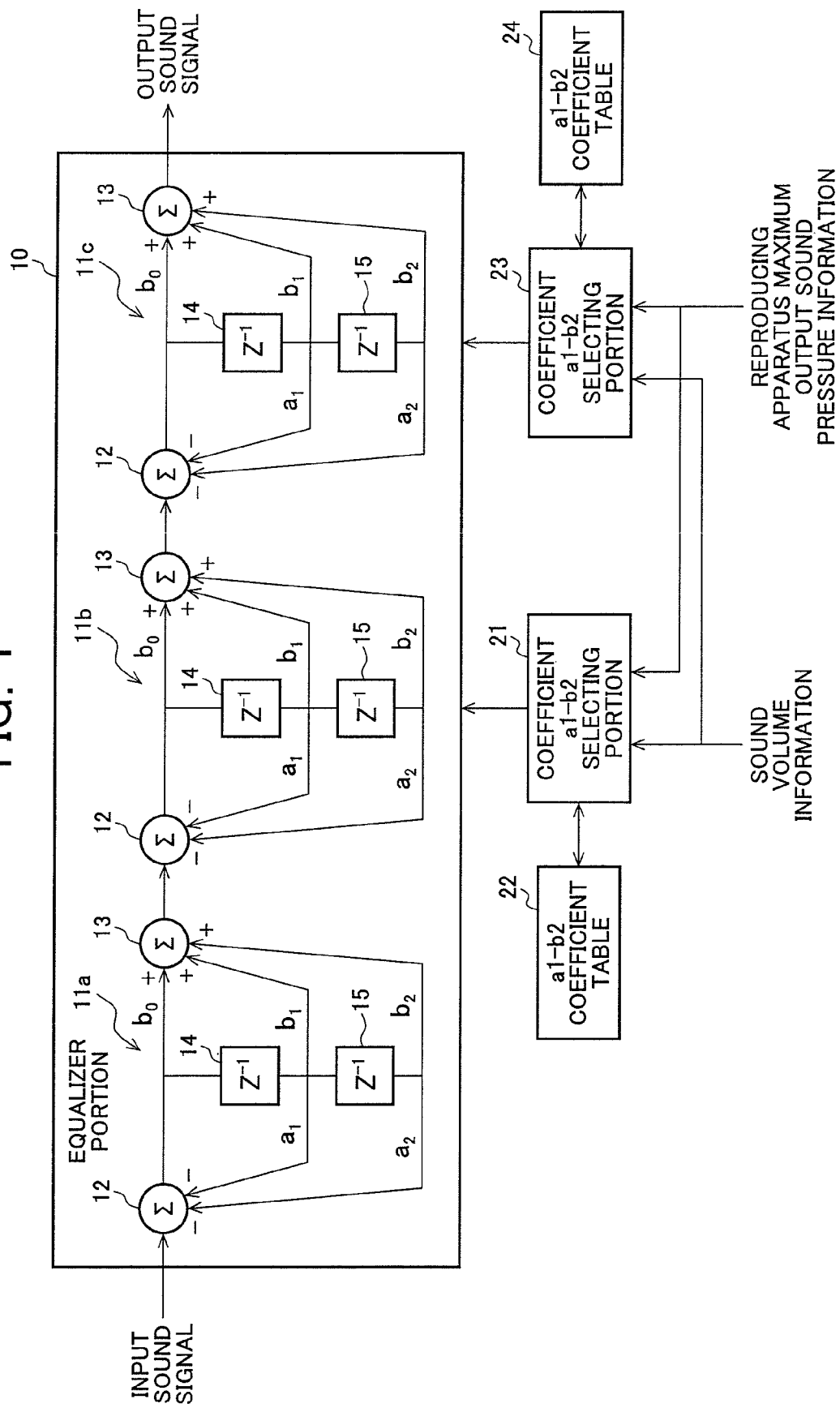
FIG. 1 is a diagram of an exemplary configuration of a first embodiment of a sound reproducing apparatus according to the present invention.

FIG. 1 is a diagram of an exemplary configuration of the first embodiment of the sound reproducing apparatus according to the present invention and depicts an exemplary configuration of an equalizer portion that changes frequency characteristics of an input sound signal. The embodiment of the sound reproducing apparatus according to the present invention is applicable to an apparatus having a means of receiving and outputting a broadcast signal, for example, an apparatus such as a television and PC. Alternatively, the embodiment is applicable to an apparatus that reproduces an input sound signal input from an external recording apparatus, such as a recorder, or an external memory, or a sound signal externally input through a network. The equalizer portion depicted in FIG. 1 converts frequency characteristics of an input sound signal and outputs the signal. The sound signal is amplified by an amplifier not depicted, and output as sound from a speaker not depicted.

The sound reproducing apparatus of this embodiment has a sound volume setting portion that enables sound volume setting of output sound from the speaker depending on a user operation, and the equalizer portion 10 changes the frequency characteristics depending on the sound volume and outputs the signal. The change in the frequency characteristics depending on the sound volume is determined based on maximum output sound pressure information of the sound reproducing apparatus.

The equalizer portion 10 of this example is a parametric equalizer made up of biquad (quadratic transfer function) digital filters 11a to 11c cascade-connected in three stages and is an equalizer capable of dividing a sound frequency band into several parts to adjust parameters such as a gain of a passage level of each band.

The equalizer portion 10 is provided with coefficient a1-b2 selecting portions 21 and 23. The coefficient a1-b2 selecting portions 21 and 23 select coefficients a1 to b2 (a1, a2, b1, and b2) of the biquad digital filters 11b and 11c on the subsequent stages based on the sound volume information of the sound reproducing apparatus and the maximum output sound pressure information of the sound reproducing apparatus to change the characteristics of the equalizer portion 10. For the coefficient selection from the coefficients a1 to b2, coefficient tables 22 and 24 are stored in advance in a storage means such as a memory of the sound reproducing apparatus and coefficients are selected from the coefficient tables based on the sound volume information and the maximum output sound pressure information. The biquad digital filter 11a on the first stage is used as a high-pass filter.

Each of the biquad digital filters 11 (11a to 11c) includes mixers 12 and 13 and two delay elements 14 and 15. Describing an example of a process, first, the mixer 12 on the input side is initialized by an input signal, and a product of a value D1 on the rear side of the first delay element 14 and the coefficient a1 is subtracted from the mixer 12. A product of a value D2 on the rear side of the second delay element 15 and the coefficient a2 is also subtracted from the mixer 12. As a result, a value D0 of the mixer 12 is determined.

The mixer 13 on the output side is overwritten by a product of the value D0 of the mixer 12 on the input side and a coefficient b0, and a product of the value D1 on the rear side of the first delay element 14 and a coefficient b11 is added to the mixer 13 on the output side. A product of the value D2 on the rear side of the second delay element 15 and the coefficient b2 is also added to the mixer 13.

The values are then updated by the actions of the delay elements 14 and 15. In other words, the value D2 on the rear side is updated with the value D1 on the front side of the second delay element 15 and the value D1 on the rear side is updated with the value D0 on the front side of the first delay element 14. A value of the mixer 13 on the output side is updated with a value of the mixer 12 on the input side.

The equalizer portion 10 repeats such processes of the biquad digital filters 11 for the number of stages and outputs the output of the mixer 13 on the output side as an output signal.

By selecting the coefficients of the biquad digital filters 11 with the configuration as described above, a level and sharpness of each frequency band can be changed. Although the configuration and the operation of the equalizer portion as described above are conventionally known techniques, in the embodiment according to the present invention, the coefficients of the equalizer portion 10 of the sound reproducing apparatus are controlled in accordance with the sound volume information and the maximum output sound pressure information of the sound reproducing apparatus to enable setting of optimum frequency characteristics for elderly persons depending on a sound volume.

FIG. 2 is a diagram of a setting example of the coefficient a1-b2 coefficient tables of FIG. 1. A first a1-b2 coefficient table 22 used by the first coefficient a1-b2 selecting portion 21 selecting the coefficients of the biquad digital filter 1ib on the second stage has coefficients set in accordance with sound volumes for each level of the reproducing machine maximum output. For example, as depicted in FIG. 2(A), at the reproducing machine maximum output level 1, the coefficients are determined such that the coefficients a1=0.9, . . . , and b2=0.6 for a sound volume 1. The coefficients are also determined for a sound volume 2 and later in the same way to a sound volume 60. In this example, the sound volumes 1 to 60 simply represent the sound output level set in 60 stages. The reproducing machine maximum output levels 1, 2 . . . are assigned as unique numbers corresponding to predetermined levels.

The same configuration as the second stage is included for the biquad digital filter 11c on the third stage. In other words, a second a1-b2 coefficient table 24 used by the second coefficient a1-b2 selecting portion 23 selecting the coefficients of the biquad digital filter 11c on the third stage has coefficients set in accordance with sound volumes for each level of the reproducing machine maximum output. For example, as depicted in FIG. 2(B), at the reproducing machine maximum output level 1, the coefficients are determined such that the coefficients a1=0.6, . . . , and b2=0.8 for the sound volume 1. The coefficients are determined in the same way for the sound volume 2 or later to the sound volume 60.

The filter on the first stage acts as a high-pass filter (HPF) having a gain that is always zero, and the output characteristics thereof are determined only by a cutoff frequency (Fc) and Q (Quality factor).

The equalizer portion 10 outputs a sound signal having characteristics adjusted by passing through the parametric equalizers on the first to third stages.

A reproducing machine maximum output sound pressure indicates the maximum sound pressure level (in dB SPL "Sound Pressure Level") reproducible by each reproducing apparatus. For example, a household electric appliance has a rated power (W) guaranteed as product specifications, and the rated power of an amplifier driving speakers is given different specifications depending on the model of the sound reproducing apparatus, such as 10 W+10 W or 5 W+5 W, in the case of two-channel, for example. The maximum output sound pressure is determined from a relationship between the rated power of the amplifier and the efficiency [dB/W/m]=[dBSPL] of the speakers of the sound reproducing apparatus.

For example, if the rating per channel is 10 W and the efficiency of a speaker is 80 DB/W/m, the reproducing machine maximum output sound pressure is 90 dBSPL. In the case of two-channel of 10 W+10 W, the reproducing machine maximum output sound pressure is about 96 dBSPL when measured with signals in the same phase.

Figure 15:
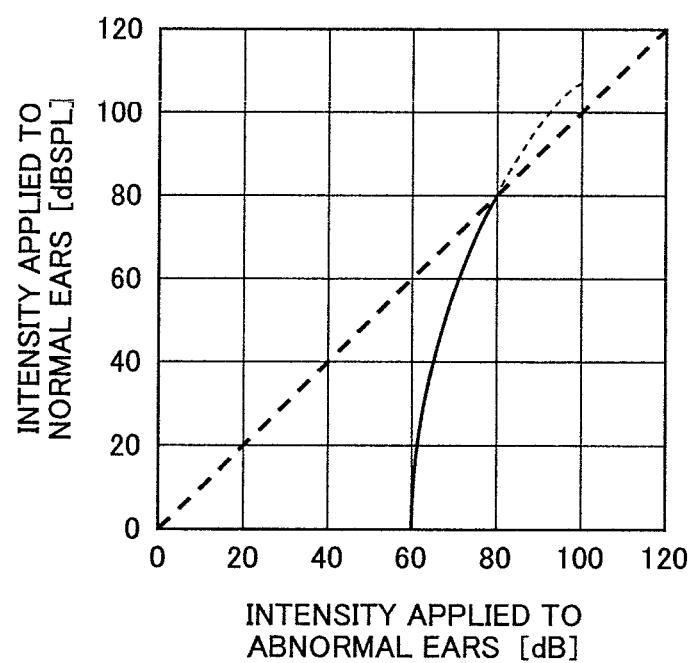
FIG. 15 is a diagram of an example of how sound is heard due to the over recruitment phenomenon depicted in a modeled manner.

On the other hand, the sound pressure depicted in FIG. 15 or sound pressures depicted in FIGS. 6, 7, 10, etc., described later are not electric characteristics and are those indicative of how the sound pressure output from the speakers of the sound reproducing apparatus is controlled. Assuming that a volume indicates the same position of the scale (e.g., the max value of 60), for example, if the rating is 5 W and the speaker efficiency is 80 dB/W/m, the reproducing machine maximum output sound pressure is 85 dBLSPL, which is 5 dBSPL lower than the case of the rating of 10 W and the speaker efficiency of 80 dB/W/m and, since a threshold value of DRC and a gain may be compressed to ranges depicted in FIGS. 6, 7, 10, 15, etc., the control reduced by 5 dBSPL must be provided. In other words, since the sound pressure level reaching the ears of listeners differs depending on how many W+how many W the sound reproducing apparatus is given as the rating power and how many dBSPL the efficiency of the speakers is, tables are necessary to the number of types generated by combinations of (types of ratings)×(types of efficiencies of speakers).

Figure 3:
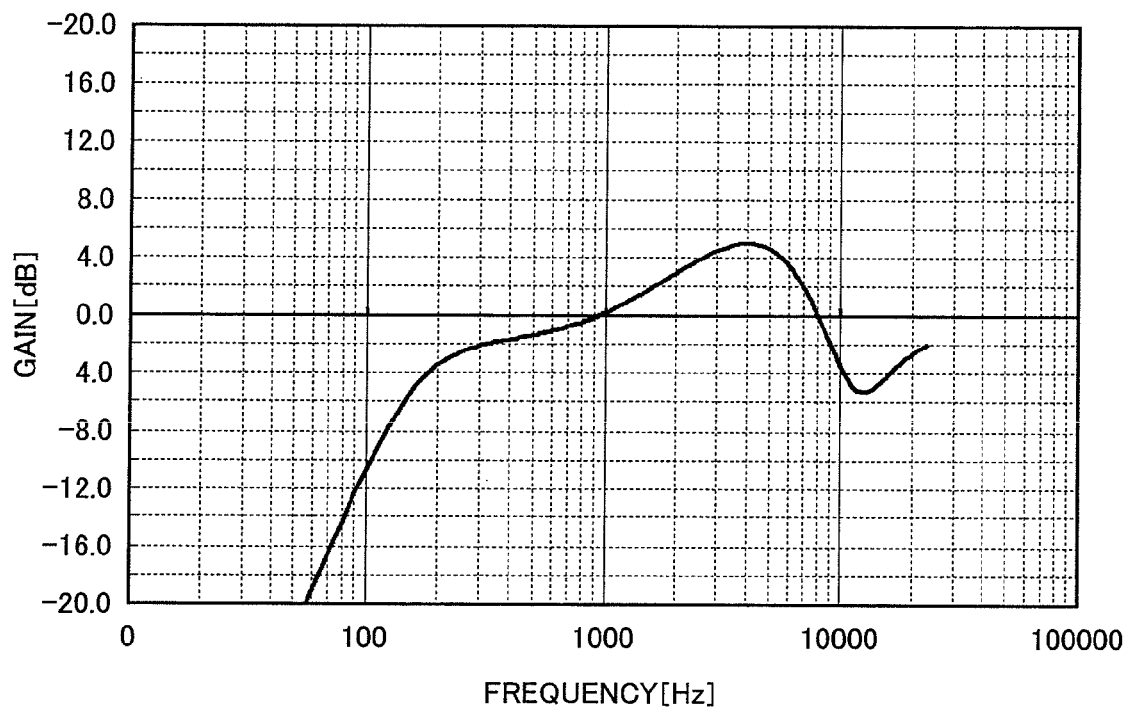
FIG. 3 is a diagram of a setting example of frequency characteristics in an equalizer portion.

FIG. 3 is a diagram of a setting example of frequency characteristics in the equalizer portion. As described above, in this embodiment, the coefficients set in the biquad digital filters 11 of the equalizer portion 10 are optimized depending on the sound volume. The example of FIG. 3 depicts frequency characteristics (FIG. 3A) in the case of a medium sound volume and values of the coefficients (FIG. 3(B)) in this case.

In the example depicted in FIG. 3(A), control is provided so as to emphasize a frequency band corresponding to human voice out of output sound, which is the frequency band particularly difficult to hear for elderly persons such that the frequency band is heard better. In this case, a gain is increased in a frequency band of frequencies from about 1 kHz to 8 kHz generally corresponding to a higher formant of the band of human voice to emphasize the frequency band as compared to other frequency bands. Although the frequency band equal to or greater than 8 KHz may also be emphasized, the sound of the higher frequency band at this level is very difficult to hear particularly for elderly persons and therefore is not necessarily heard well even if the sound pressure is increased. If the higher frequency band is emphasized, since the peak component of the output sound signal is saturated and a signal waveform may be clipped, it is not necessary to forcibly emphasize the frequency band. From such a viewpoint, the coefficients of the equalizer portion 10 are set such that the frequency characteristics depicted in FIG. 3(A) are acquired in the case of a medium sound volume. FIG. 3(B) depicts a setting example of coefficients in this case and depicts an example of coefficients set in each of the parametric equalizers of 1 to 3 (on the first to third stages).

The high-pass filter on the first stage has a cutoff frequency of 160 Hz, for example, and the characteristics of the high-pass filter on the first stage are flattened when frequency is equal to or greater than 300 Hz in view of the relationship between frequency and gain [dB]. This is because elderly persons have the same degree of audibility as younger persons for sound in lower frequency bands such as those equal to or lower than 300 Hz and are not subjected to the over recruitment phenomenon. Since the frequency characteristics of the equalizer portion are reduced particularly in frequency characteristics on the lower band side including sound effects and noises other than the frequency band corresponding to human voice, preferably, the characteristics of the high-pass filter on the first stage are not flattened in all the frequency bands and, byway of example, the cutoff frequency is set as described above.

Figure 4:
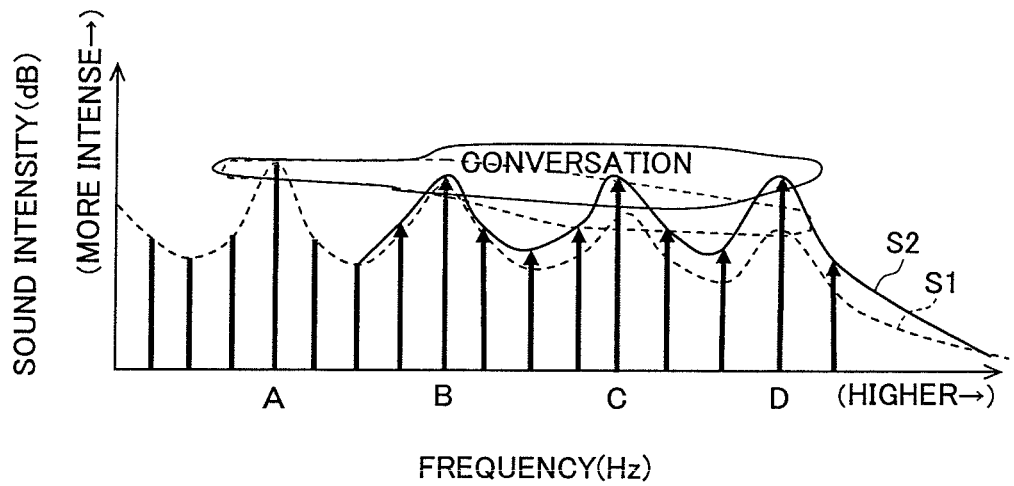
FIG. 4 is a diagram for explaining an effect when a gain of a frequency band of frequencies from about 1 kHz to 8 kHz is increased to emphasize the frequency band as compared to other frequency bands.

FIG. 4 is a diagram for explaining an effect when a gain of the frequency band of frequencies from about 1 kHz to 8 kHz is increased to emphasize the frequency band as compared to other frequency bands.

Normal human voices have a characteristic distribution with energy concentrated on A, B, C, and D on frequencies as indicated by S1 of FIG. 4. These A, B, C, and D are referred to as a fundamental frequency, a first formant, a second formant, and a third formant, respectively. In general, sound is most intense at the fundamental frequency and attenuates at higher formants.

In this embodiment, the normally attenuating first to third formants are amplified as indicated by S2 for adjustment to easily transmitted (easily heard) sound quality. While a sound volume is relatively low, a medium frequency range of frequencies from about 1 kHz to 8 kHz is relatively emphasized, and the frequency characteristics are changed into a more flattened shape as the sound volume increases.

Figure 5:
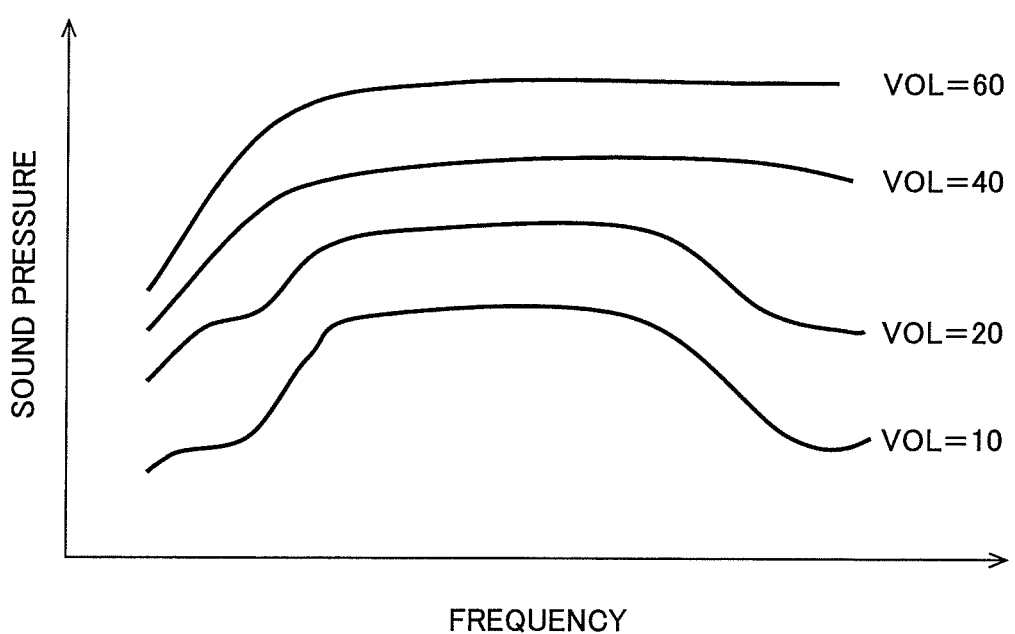
FIG. 5 is a schematic of an example of frequency characteristics changed in conjunction with a sound volume.

FIG. 5 is a schematic of an example of frequency characteristics changed in conjunction with a sound volume. As described above, in this embodiment, the frequency characteristics of output sound from the equalizer portion 10 are converted depending on a sound volume set in the sound reproducing apparatus. In this example, it is assumed that levels of the sound volume are represented by 1 to 60, for example. As depicted in FIG. 5, while the sound volume is relatively low, a medium frequency range is relatively emphasized and a low frequency range and a high frequency range are relatively low. As the sound volume increases, the coefficients of the equalizer portion are changed and the frequency characteristics are changed into a more flattened shape. When the sound volume is at the maximum (VOL=60 in this example), almost flat frequency characteristics are achieved except in some areas closer to the lowest frequency. Therefore, in this embodiment, control is provided such that the gain characteristics corresponding to frequencies are changed from the frequency characteristics having the sound band including the human voice band emphasized to the gradually flattened frequency characteristics in accordance with increase in the sound volume set by the sound volume setting portion.

By relatively strongly emphasizing the frequency band of human at a lower sound volume to make human voice easily heard by elderly persons and achieving the more flattened frequency characteristics as the sound volume becomes larger in this way, easily heard sound output can be performed while suppressing annoyance caused by the emphasis on a certain frequency band.

In this embodiment, a reproduction mode for elderly persons and a reproduction mode for younger persons may be prepared and, when the reproduction mode for elderly persons is selected by a user operation, the control may be provided such that the frequency characteristics are changed in accordance with increase in the sound volume as described above. A means for selecting the reproduction mode for elderly persons and the reproduction mode for younger persons in this case corresponds to a listener selecting portion of the present invention.

[Second Embodiment]

In the case of elderly persons, the level of minimum audible limit rises due to aging and a sound with a smaller sound pressure is difficult to hear as compared to younger ages. As described above, the over recruitment phenomenon may occur on the upper limit side of comfortably heard sound pressure and, for example, reproduction with a sound pressure exceeding 70 to 80 dBSPL is not suitable for elderly persons.

Therefore, a range of optimum sound pressure level for elderly persons is generally narrower than younger ages. To address such elderly persons, a dynamic range of reproduction sound pressure for elderly persons is set in this embodiment.

Figure 6:
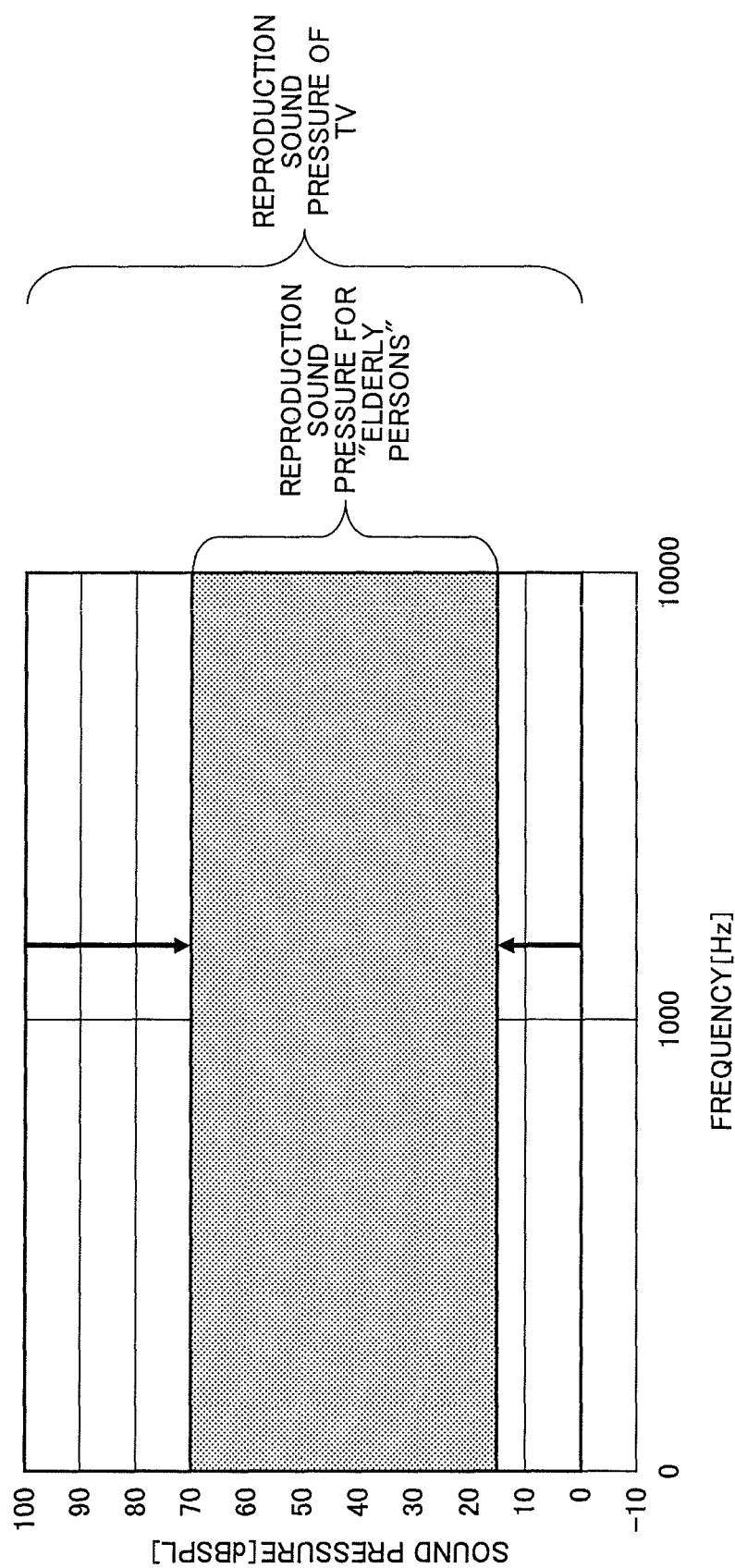
FIG. 6 is a diagram of a setting example of a range width of reproduction sound pressure for elderly persons.
Figure 7:
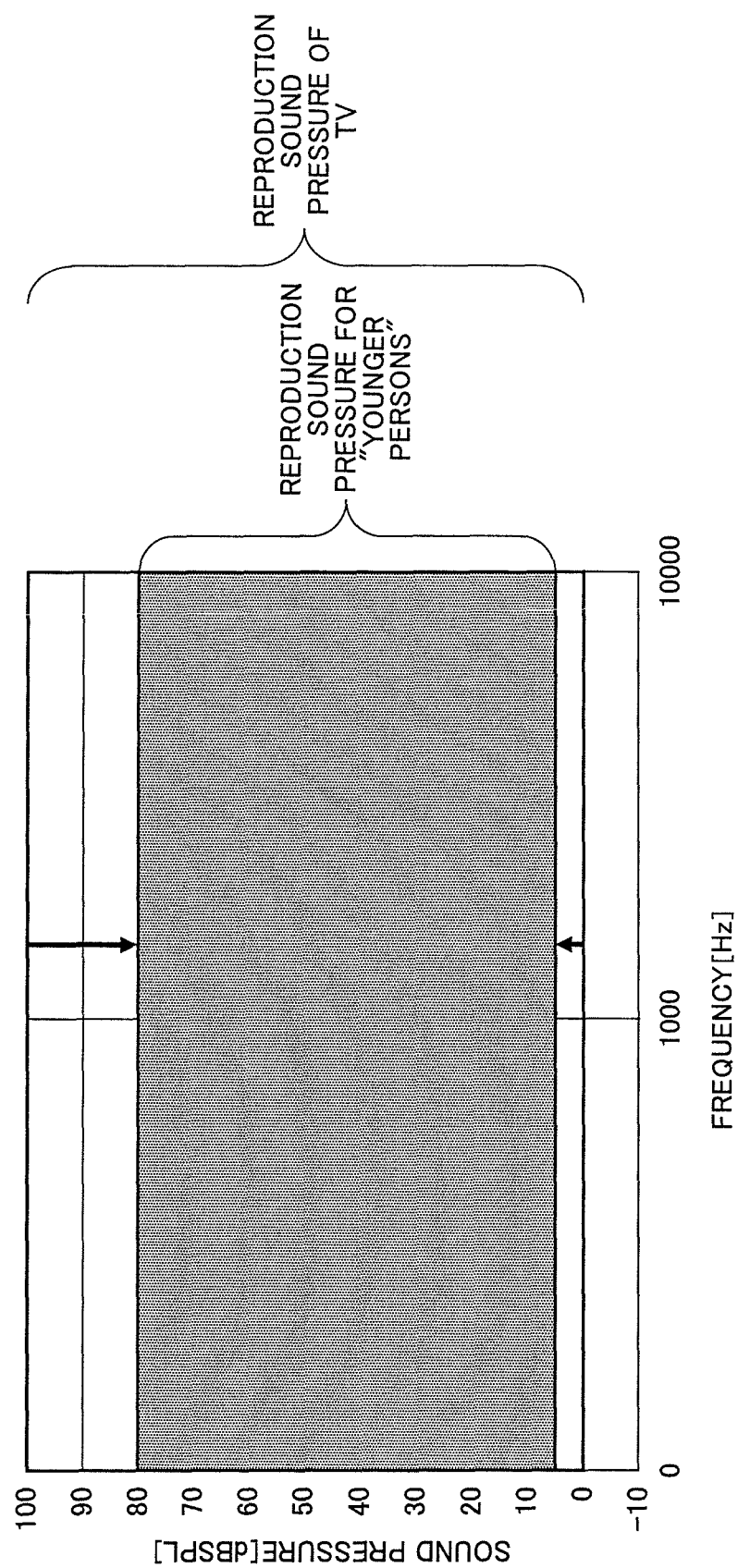
FIG. 7 is a diagram of a setting example of a range width of reproduction sound pressure for younger persons.

FIG. 6 is a diagram of a setting example of a range width of reproduction sound pressure for elderly persons and FIG. 7 is a diagram of a setting example of a range width of reproduction sound pressure for younger persons. FIGS. 6 and 7 depict the range widths of reproduction sound pressure when a setting output sound volume is at the maximum in a television to which a record reproducing apparatus is applied, for example.

As depicted in FIG. 6, in this example, the reproduction sound pressure for elderly persons is defined with the upper limit around 70 dBSPL and the lower limit around 15 dBSPL. The reason is that elderly persons do not prefer sound reproduced with larger sound pressure as explained in terms of the over recruitment phenomenon etc., and have a higher minimum audible level as described above. In comparison, as depicted in FIG. 7, the reproduction sound pressure range for younger persons can be defined with the upper limit of 80 dBSPL and the lower limit equal to or less than 10 dBSPL. This is because younger persons can listen to reproduced sound without feeling discomfort or annoyed even if a wider reproduction range is defined.

As described above, in this embodiment, a dynamic range of the reproduction sound pressure for elderly persons is set. The reproduction mode for elderly persons and the reproduction mode for younger persons may be prepared and these modes may be switched by a user operation as needed.

In this embodiment, a compression rate of the dynamic range of the reproduction sound pressure for elderly persons is changed in accordance with a change in the sound volume of the sound reproducing apparatus. More specifically, the compression rate of the dynamic range is increased in accordance with increase in the sound volume of the sound reproducing apparatus. As a result, elderly persons can listen to reproduced sound without feeling annoyed due to the over recruitment phenomenon even when the sound volume is larger.

Figure 8:
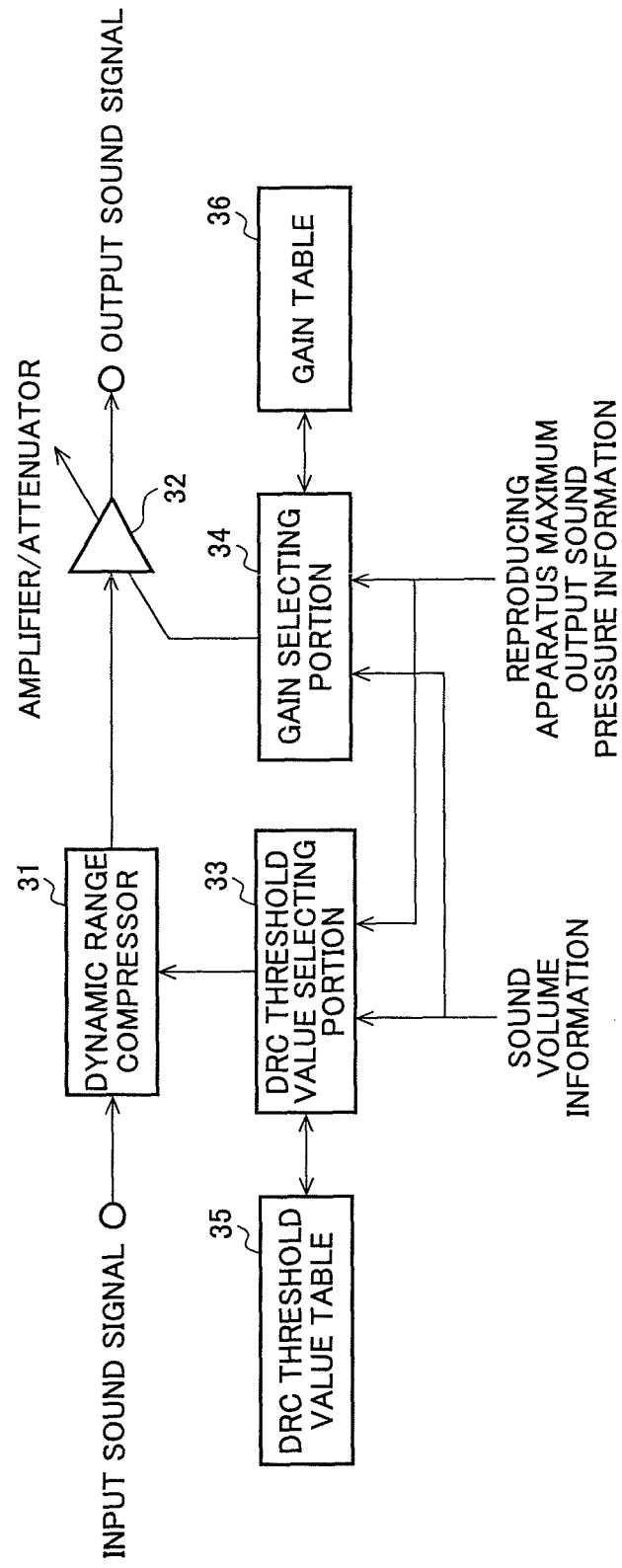
FIG. 8 is a diagram for explaining a second embodiment of the sound reproducing apparatus according to the present invention.

FIG. 8 is a diagram for explaining a second embodiment of the sound reproducing apparatus according to the present invention.

The sound reproducing apparatus of this embodiment includes a dynamic range compressor 31 that compresses a dynamic range of an input sound signal, and an amplifier/attenuator 32 that amplifies/attenuates an output sound signal from the dynamic range compressor 31. The sound reproducing apparatus has a DRC (dynamic range compression) threshold value selecting portion 33 that selects a threshold value of the dynamic range compressor 31 and a gain selecting portion 34 that selects a gain in the amplifier/attenuator 32, and the DRC threshold value selecting portion 33 and the dynamic range compressor 31 select the threshold value of the dynamic range compressor 31 and select the gain of the amplifier/attenuator 32, based on the sound volume information and the reproducing machine maximum output sound pressure information of the sound reproducing apparatus.

The dynamic range compressor 31 and the amplifier/attenuator 32 change levels of output sound signals based on signal levels of input sound signals. For example, the dynamic range compressor 31 outputs a sound signal at a level directly proportional to an input signal level until the frequency of the input sound signal reaches the threshold value, and outputs a sound signal at a level attenuated relatively to the input signal level if the frequency of the sound signal exceeds the threshold value. The amplifier/attenuator 32 amplifies/attenuates the output signal output from the dynamic range in accordance with the set gain and outputs the signal. The dynamic range compression rate (range width) can arbitrarily be changed by manipulating the threshold value.

With such a configuration of the dynamic range compressor 31 and the amplifier/attenuator 32, the overall dynamic range of input sound signals can be appropriately compressed and the reproduction of the sound signals can accurately be performed in accordance with the signal level of the sound signals. The dynamic range compressor 31 and the amplifier/ attenuator 32 may be configured as ALC (auto level control) by combining the dynamic range compressor 31 and the amplifier/attenuator 32.

The threshold value selected by the DRC threshold value selecting portion 33 can be stored in advance as a DRC threshold table 35 in a storage means such as a memory. In this case, the threshold values corresponding to sound volumes are set for each level of the reproducing machine maximum output in the DRC threshold table 35. FIG. 9(A) depicts a setting example of the DRC threshold table. In this example, at the reproducing machine maximum output level 1, the threshold value of −5 dB is determined for the sound volume 1 and the threshold value of −6 dB is determined for the sound volume 2. The threshold values are also determined after the sound volume 2 in the same way to the sound volume 60. As is the case with the first embodiment, the sound volumes 1 to 60 simply represent the sound output level set in 60 stages, and the reproducing apparatus maximum output levels 1, 2 . . . are assigned as unique numbers corresponding to predetermined levels.

The gain selected by the gain selecting portion 34 can be stored in advance as a gain table 36 in the storage means such as a memory. In this case, the gains corresponding to sound volumes are set for each level of the reproducing machine maximum output in the gain table 36. FIG. 9(B) depicts a setting example of the gain table. In this example, at the reproducing machine maximum output level 1, the gains are determined such as a gain of 1.5 for the sound volume 1 and a gain of 1.4 for the sound volume 2. The gains are also determined in the same way after the sound volume 2 to the sound volume 60. Also in this example, the sound volumes 1 to 60 simply represent the sound output level set in 60 stages. The reproducing apparatus maximum output levels 1, 2 . . . are assigned as unique numbers corresponding to predetermined levels.

With the configuration as described above, in this embodiment, based on the sound volume information and the maximum output sound pressure information of the record reproducing apparatus, the DRC threshold value selecting portion 33 selects a threshold value from the DRC threshold table 35 to change the compression characteristics in the dynamic range compressor 31, and the amplification/attenuation rate is optimized by the gain selected by the gain selecting portion 34.

Figure 10:
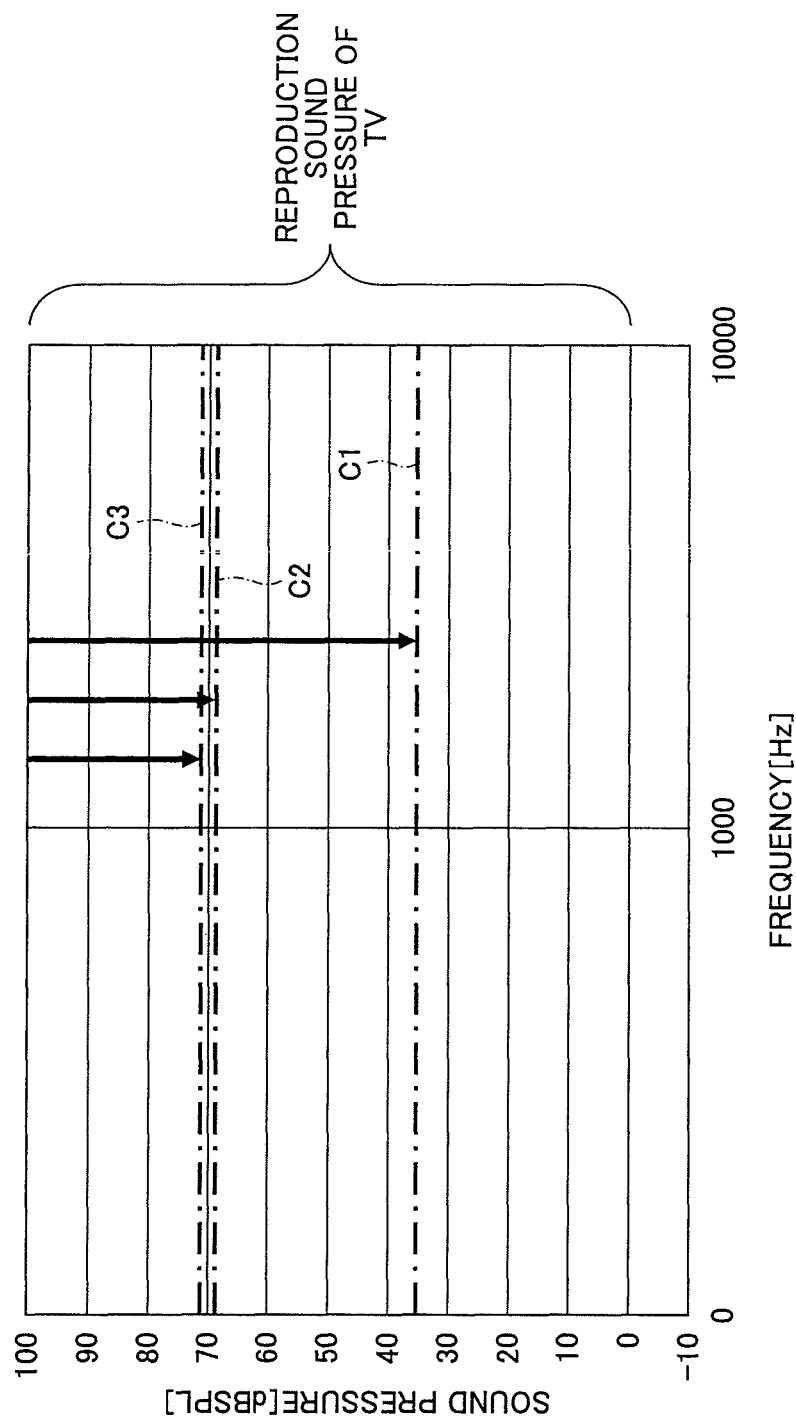
FIG. 10 is a diagram for explaining a setting example of dynamic range compression characteristics changed in conjunction with a sound volume.

FIG. 10 is a diagram for explaining a setting example of the dynamic range compression characteristics changed in conjunction with a sound volume. If the compression rate of the dynamic range is not changed in the dynamic range compressor 31, the upper limit sound pressure raises as the sound volume of the record reproducing apparatus increases. In contrast, in this embodiment, the compression rate of the dynamic range is changed in accordance with increase in the sound volume of the sound reproducing apparatus. Specifically, the threshold value for the dynamic range compressor 31 is set lower to increase the compression rate of the dynamic range. In this situation, the compression rate of the dynamic range is nonlinearly increased relative to the increase in the sound volume. In other words, as the sound volume increases, the inclination of the compression rate relative to the sound volume is made larger.

For example, as depicted in FIG. 10, when a compression upper limit C1 at the sound volume 20 is around 35 dBSPL, if the sound volume of the record reproducing apparatus is increased to the sound volume 50, a compression upper limit C2 is set to a little less than 70 dBSPL. If the sound volume is set to the sound volume 60, which is the maximum sound volume of this example, a compression upper limit C3 is set closer to a little over 70 dBSPL.

If the compression rate of the dynamic range is constant, the compression upper limit increases in accordance with increase in the sound volume and reaches the sound pressure that may make elderly persons feel annoyed (e.g., 70 to 80 dBSPL or more). In contrast, in this embodiment, the increase in the compression upper limit corresponding to the increase in the sound volume is nonlinearly suppressed to reduce the dynamic range width in accordance with the increase in the sound volume. In other words, the dynamic range compression rate is increased in accordance with the increase in the sound volume.

As a result, even if the sound volume of the sound reproducing apparatus becomes larger, the level of the maximum sound pressure to be reproduced is suppressed to a certain level or less (around 70 dBSPL or less at the maximum sound volume in this example) and elderly persons can listen to the reproduced sound without feeling annoyed.

The dynamic range of the reproduced sound for elderly persons has a lower limit value set higher than that for younger persons as depicted in FIG. 6. This means that if a sound signal of a smaller sound volume is input, an output value is raised to reproduce the sound signal with a higher sound pressure. The lower limit value is set by setting the gain for the amplifier/attenuator 32 of FIG. 8. In this case, a fixed value independent of signal amplitude of an input sound signal is set to raise the sound pressure level of the lower limit value of the dynamic range.

As described above, in this embodiment, by suppressing the upper limit value of the dynamic range through the selection of the threshold value for the dynamic range compressor 31, the compression rate of the dynamic range is increased in accordance with increase in sound volume of the reproducing apparatus, and the lower limit value of the dynamic range is raised by setting the gain for the amplifier/attenuator 32. As a result, the sound reproduction can be performed with the optimum dynamic range for elderly persons.

[Third Embodiment]

The sound reproducing apparatus of this embodiment is configured as an apparatus extracting a common component from a plurality of channels of input signals, subtracting the common component from the channel components to calculate components other than the common component, and changing the proportions of the extracted common component and the components other than the common component to mix the components.

With this configuration, for example, sound signals of human voice are taken out as a common component. The sound signals of human voice are recorded to be localized in the center by collecting sound with a sound-collecting microphone, for example and are distributed to an L-channel and an R-channel. A common component including human voice can be acquired by taking out the common component of the L-channel and the R-channel from such sound signals.

In this embodiment, the proportions of the common component including human voice and the components other than the common component are optimized for elderly persons. Particularly, the proportions and the gains of the common component including human voice and the components other than the common component are changed in accordance with the sound volume of the sound reproducing apparatus. Specifically, when the sound volume of the record reproducing apparatus is small, the gain of the common component is increased to make the mixture proportion of the common component higher, thereby emphasizing the common component including human voice. As a result, the human voice becomes easier to hear at a smaller sound volume. When the sound volume of the record reproducing apparatus becomes larger, the gain of the common component including human voice is made smaller such that the proportion is changed to be equal to that of the components other than the common component, thereby reducing the sense of annoyance due to the over recruitment phenomenon at a larger sound volume.

Figure 11:
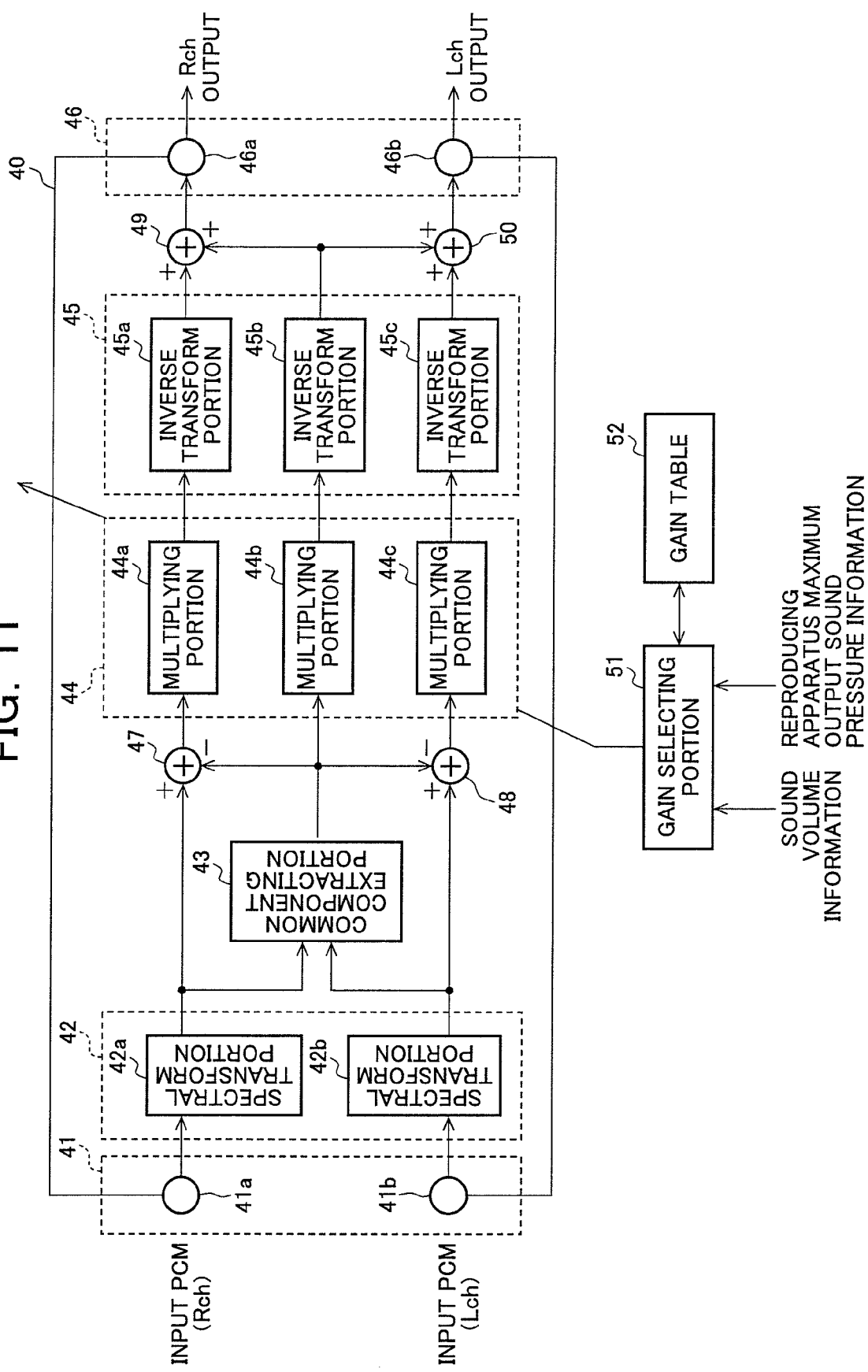
FIG. 11 is a block diagram of a third embodiment of the sound reproducing apparatus according to the present invention.

FIG. 11 is a block diagram of the third embodiment of the sound reproducing apparatus according to the present invention. The sound reproducing apparatus according to this embodiment includes a sound signal transform portion 40 that has a function of separating an input sound into a common component and components other than the common component and adjusting a mixture ratio and gains of these components.

The sound signal transform portion 40 includes spectral transform portions 42 (42a, 42b), a common component extracting portion 43, multiplying portions 44 (44a, 44b, 44c), inverse transform portions 45 (45a, 45b, 45c), subtracters 47, 48, input terminals 41a, 41b, output terminals 46a, 46b, and adders 49, 50.

A plurality of sound signals respectively corresponding to a plurality of channels is input to the sound signal transform portion 40. In this example, two-channel sound signals digitally encoded by PCM (pulse Code Modulation) are input to the sound signal transform portion 40. The two-channel sound input signals may be stereo sound signals in television broadcasting, for example. In the stereo broadcasting, normally, different sound signals are supplied to left and right speakers included in the sound reproducing apparatus such as a television based on the input two-channel sound signals, and different sounds are output from the respective speakers. A left-side sound signal corresponding to a left channel and a right-side sound signal corresponding to a right channel are respectively input from the input terminals 41a and 41b to the sound signal transform portion 40, and the sounds output from the sound signal transform portion 40 are output as sounds from the left and right speakers.

The spectral transform portion 42a divides the right-side sound signal input through the input terminal 41a into 1024 samples per frame, for example. If the sampling frequency of the sound signal is 44.1 kHz, a time per frame is 23 ms (=(1/44100)×1024). The spectral transform portions 42 then multiplies the frame-divided sound signal by a window function such as the Hanning window. The application of the window function can reduce an error in frequency analysis of the frame-divided sound signal. The window function applied to this embodiment is not limited to the Hanning window.

The spectral transform portion 42a then performs the fast Fourier transform (FFT) of the sound signal to which the window function is applied, for each frame, and transforms the sound signal in the time domain into data, i.e, a spectrum of the frequency domain (hereinafter, right-side sound signal spectrum), which is output to the common component extracting portion 43 and the subtracter 47.

The spectral transform portion 42b uses the same process as the spectral transform portion 42a to calculate and output a spectrum of the left-side sound signal input through the input terminal 41b (hereinafter, left-side sound signal spectrum) to the common component extracting portion 43 and the subtracter 48.

The frequency spectrums may be calculated by the modified discrete cosine transform instead of FFT and the technique of the spectrum transform is not particularly limited.

The common component extracting portion 43 extracts a common component of the right-side sound signal spectrum and the left-side sound signal spectrum. FIG. 12 is a diagram for explaining the common component; FIG. 12(A) is a diagram of the common component of the right-side sound signal spectrum and the left-side sound signal spectrum; and FIG. 12(B) is a diagram of the common component only. The common component extracting portion 43 calculates and outputs a common component spectrum C(k) from C(k)=MIN (XL(k),XR(k)) (where XL(k) is the left-side sound signal spectrum and XR(k) is the right-side sound signal spectrum) to the subtracters 47, 48 and the multiplying portion 44b. The common component extracting portion 43 extracts a smaller spectrum of XR(k) and XL(k) as the common component.

As described above, two-channel input signals of a stereo broadcasting program etc., are input to the sound signal transform portion 40. In a typical stereo broadcasting program, sound is recorded through a single-channel microphone for sound recording, and BGM, sound effects, etc., except vocal are recorded in advance through two left and right microphones (stereo). If the program recorded through these three microphones is stereo-broadcasted through two channels, signals of three channels are down-mixed into two channels. Therefore, a sound signal of human voice recorded through the single-channel microphone for sound recording is mixed with signals of ambient sound recorded through the two left and right microphones to send out the two-channel sound signals.

In this situation, a rate of mixing of the human voice signal and the ambient sound signals is set by a broadcast station. In this case, the right-side sound signal is a sound signal acquired by mixing the sounds recorded by the right microphone and the single-channel microphone for sound recording. The left-side sound signal described above is a sound signal acquired by mixing the sounds recorded by the left microphone and the single-channel microphone for sound recording. Therefore, a sound signal representative of human voice is common to and included in the left-side sound signal and the right-side sound signal. In the case of music including vocal, the vocal is recorded through a single-channel microphone for sound recording and, after instrument sounds are recorded through two left and right microphones (stereo), the vocal and the sounds are down-mixed into two channels.

The common component extracting portion 43 mainly extracts as the common component a component of the sound signal representative of human voice common to and included in the right-side sound signal and the left-side sound signal as described above.

The subtracter 47 subtracts the common component spectrum C(k) output from the common component extracting portion 43, from the right-side sound signal spectrum XR(k) output from the spectral transform portion 42a, to calculate and output a right component spectrum XR'(k) to the multiplying portion 44a. Similarly, the subtracter 48 subtracts the common component spectrum C(k) output from the common component extracting portion 43, from the left-side sound signal spectrum XL(k) output from the spectral transform portion 42b, to calculate and output a left component spectrum XL'(k) to the multiplying portion 44c.

The multiplying portion 44a multiplies the XR'(k) output from the subtracter 47 by a gain G1 to calculate and output XR"(k) (=G1×XR'(k)) to the inverse transform portion 45a. The multiplying portion 44b multiplies the C(k) output from the common component extracting portion 43 by a gain G2 to calculate and output C"(k) (=M2×C(k)) to the inverse transform portion 45b. The multiplying portion 44c multiplies the XL'(k) output from the subtracter 48 by a gain G3 to calculate and output XL"(k) (=M1×XL'(k)) to the inverse transform portion 45c.

The inverse transform portion 45b transforms the common component C"(k) output from the multiplying portion 44b into a signal waveform in the time domain by using inverse FFT and distributes and outputs the signal waveform to the adders 49 and 50.

The inverse transform portion 45a transforms the right component output spectrum XR"(k), which is information in the frequency domain, into a signal waveform in the time domain by using inverse FFT and outputs the signal waveform. The adder 49 adds and outputs the right component subjected to the inverse FFT and the common component output from the inverse transform portion 45b as a sound output signal output to a right speaker.

Similarly, the inverse transform portion 45c transforms the left component output spectrum XL"(k), which is information in the frequency domain, into a signal waveform in the time domain by using inverse FFT and outputs the signal waveform. The adder 50 adds and outputs the left component subjected to the inverse FFT and the common component output from the inverse transform portion 45b as a sound output signal output to a left speaker.

The gain G2 applied to the common component spectrum is a value satisfying $1 \leq M1$ and the gains G1 and G3 applied to the component spectrums (the right component spectrum XR'(k) and the left component spectrum XL'(k)) other than the common component are values satisfying $0 \leq M1 \leq 1$. The multiplying portions 44a, 44b, and 44c multiply the spectrums of input components by using these gains as multiplying values to change the mixture proportions and the gains of the common component spectrum and the spectrums other than the common component.

The gains set in the multiplying portions 44a, 44b, and 44c are selected by a gain selecting portion 51. The values of gains selected by the gain selecting portion 51 are stored and retained in advance as a gain table 52 in the storage means such as a memory. The gain table 52 has gains corresponding to sound volumes set for each level of the reproducing machine maximum output.

Figures 13, 14:
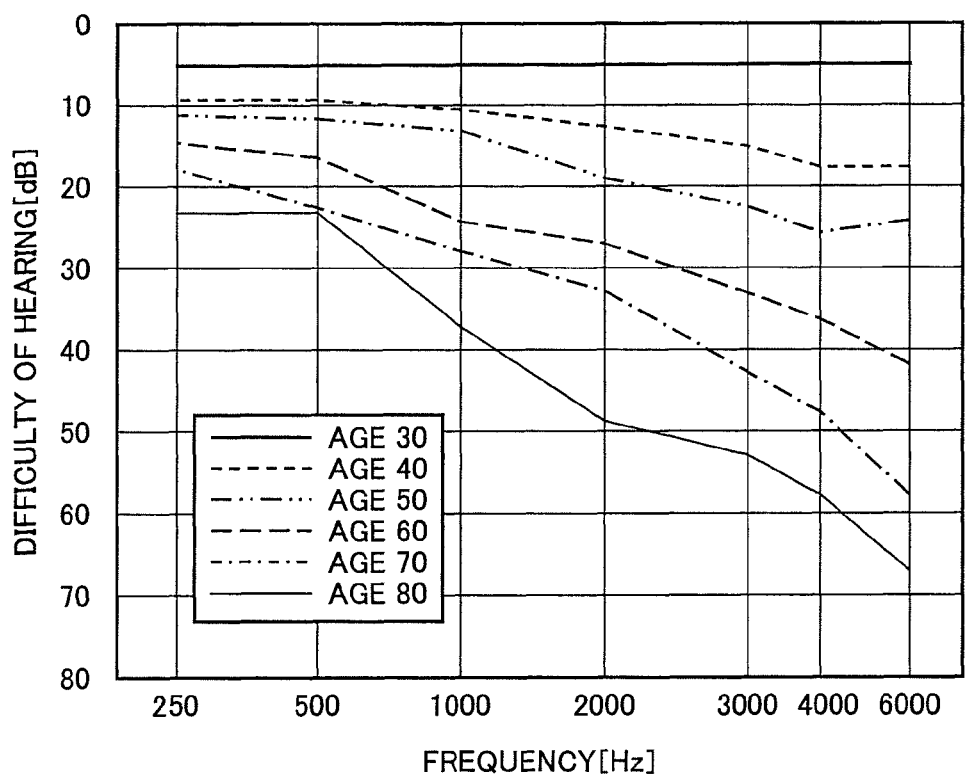
FIG. 13 is a diagram of a setting example of a gain table in the configuration of FIG. 10.
FIG. 14 is a diagram of a state of deterioration in hearing due to aging depicted in a modeled manner.

FIG. 13 is a diagram of a setting example of the gain table. In this example, at the reproducing machine maximum output level 1, the gains of the multiplying portion 44a (defined as a multiplying portion (1)), the multiplying portion 44b (defined as a multiplying portion (2)), and the multiplying portion 44c (defined as a multiplying portion (3)) are set to 0.7, 1.5, and 0.7 for the sound volume 1. The gains to be multiplied by the respective multiplying portions 44a to 44c are also set for the sound volume 2 and later in the same way. The sound volumes 1 to 60 simply represent the sound output level set in 60 stages. The reproducing machine maximum output levels 1, 2 . . . are assigned as unique numbers corresponding to predetermined levels.

The gain selecting portion 51 inputs the sound volume information of the sound reproducing apparatus and the maximum output sound pressure information of the sound reproducing apparatus and refers to the gain table to extract and set corresponding gain values to the multiplying portions 44a to 44c. Therefore, the mixture proportions and the gains of the common component spectrum and the spectrums other than the common component can be set to values corresponding to the sound volume of the sound reproducing apparatus.

The gains set in the gain table 52 are defined as values that increase the proportion of the common component including human voice and that emphasize the common component with the gains when the sound volume of the record reproducing apparatus is small. As the sound volume of the sound reproducing apparatus increases, the gain of the common component including human voice is reduced and the gains of the components other than the common component are increased such that the gain of the common component and the proportion of the components other than the common component are changed and gradually become equal when the components are reproduced.

For example, in the example of FIG. 13, at the small sound volume 1, the gains of the multiplying portions 44a and 44c for the components other than the common component are 0.7, and the gain of the multiplying portion 44b for the common component is 1.5. As a result, a ratio of the common component and the components other than the common component output from the multiplying portions 44 is 1.5:0.7. This means that the proportion of the common component is larger and that the common component is emphasized and output with the gain of the common component of 1.5.

On the other hand, in the example of FIG. 13, at the sound volume 60, all the gains are 1.0 in the multiplying portions 44a and 44c for the components other than the common component and the multiplying portion 44b for the common component. As a result, the common component and the components other than the common component are output in the same proportions. The gain of the common component is 1.0 and the gain of the emphasized common component is lowered to the same level as the other components.

In the embodiment of the present invention, preferably, the gain of the common component is set equal to or greater than 1 at a smaller sound volume and the gain of the common component is reduced in accordance with increase in the sound volume of the sound reproducing apparatus to provide control such that the mixture proportions of the common component and the components other than the common component are gradually made equal.

As described above, in this embodiment, the human voice included in the common component becomes easier to hear by increasing the proportion and the gain of the common component at a smaller sound volume, and when the sound volume becomes larger, by equally outputting the common component and the components other than the common component and reducing the gain of the common component, the sense of annoyance due to the over recruitment phenomenon can be reduced, and the optimum sound output control for elderly persons can be provided.

As is the case with the embodiment described above, the reproduction mode for elderly persons and the reproduction mode for younger persons may be prepared and, when the reproduction mode for elderly persons is selected by a user operation, the control may be provided so as to change the proportions and the gains of the common component and the other components in accordance with increase in the sound volume as described above.

A program operating on the sound reproducing apparatus of this embodiment is a program that controls CPU etc., (program operable to drive a computer to function) so as to implement the functions of the means (or a portion of the means) according to the present invention. This program may include a graphical user interface (GUI) for a displaying apparatus so as to facilitate use of the sound reproducing apparatus by a user. Information handled by the sound reproducing apparatus is temporarily accumulated in the RAM at the time of processing and subsequently stored in various ROMs and HDDs and is read and modified/written by the CPU as needed.

A recording medium storing the program may be any of semiconductor mediums (e.g., ROM and a non-volatile memory card), optical recording mediums (e.g., BD, DVD, MO, MD, CD, and BD), and magnetic recording mediums (e.g., magnetic tape and flexible disc).

Not only are the functions of the embodiments implemented by executing the loaded program, but also the functions of the present invention may be implemented by executing a process in cooperation with an operating system or another application program etc., based on the instructions from the program. If distributed to the market, the program can be stored and distributed in portable recording mediums or can be transferred through a network such as the Internet to connected server computers.

Industrial Availability

Since human voices such as vocals and words can be emphasized in contents being broadcasted or reproduced, the sound signal transform apparatus according to the present invention is preferably utilizable with a television receiving apparatus, etc.

Explanations of Reference Numerals

10 . . . equalizer portion; 11a, 11b, 11c . . . biquad digital filter; 12, 13 . . . mixer; 14 . . . delay element; 14, 15 . . . delaying device; 15 . . . delay element; 21 . . . first coefficient a1-b2 selecting portion; 22 . . . first coefficient a1-b2 coefficient table; 23 . . . second coefficient a1-b2 selecting portion; 24 . . . second coefficient a1-b2 coefficient table; 31 . . . dynamic range compressor; 32 . . . amplifier/attenuator; 33 . . . DRC threshold value selecting portion; 34 . . . gain selecting portion; 35 . . . DRC threshold value table; 36 . . . gain table; 40 . . . sound signal transform portion; 41a, 41b . . . input terminal; 42 . . . spectral transform portion; 42a . . . spectral transform portion; 42b . . . spectral transform portion; 43 . . . common component extracting portion; 44 . . . multiplying portion; 44a, 44b, 44c . . . multiplying portion; 45 . . . inverse transform portion; 45a . . . inverse transform portion; 45b . . . inverse transform portion; 45c . . . inverse transform portion; 46a, 46b . . . output terminal; 47, 48 . . . subtracter; 49, 50 . . . adder; 51 . . . gain selecting portion; and 52 . . . gain table.

The invention claimed is:

1. A sound reproducing apparatus comprising:
    a frequency characteristic setting portion that sets frequency characteristics of an input sound signal; and
    a sound volume setting portion that variably controls a sound volume when a sound signal is output as sound, wherein
    the frequency characteristic setting portion makes a change from frequency characteristics with a sound band including a band of human voice emphasized to frequency characteristics with gain characteristics corresponding to frequency gradually flattened in accordance with increase in the sound volume set by the sound volume setting portion.

2. The sound reproducing apparatus as defined in claim 1, wherein the sound band is a range from about 1 kHz to 8 kHz.

3. The sound reproducing apparatus as defined in claim 1, comprising
    a listener selecting portion that selects whether a listener is an elderly person or a younger person depending on a user operation, wherein
    if the elderly person is selected, the frequency characteristics are changed in accordance with increase in the sound volume set by the sound volume setting portion.

4. A sound reproducing apparatus, comprising:
    a portion for extracting a common spectral component from a plurality of spectra respectively corresponding to a plurality of channels by applying a minimum function to the plurality of the spectra;
    a portion for subtracting the common spectral component from each of the plurality of the spectra to extract a spectral component other than the common spectral component for each of the plurality of the spectra;
    a portion for changing gains of the extracted common spectral component and the components other than the common spectral component to mix the components; and
    a sound volume setting portion for variably controlling a sound volume when a sound signal is output as sound, wherein
    the sound reproducing apparatus reduces the gain of the common spectral component in accordance with increase in the sound volume set by the sound volume setting portion.

5. The sound reproducing apparatus as defined in claim 4, comprising
    a listener selecting portion that selects whether a listener is an elderly person or a younger person depending on a user operation, wherein
    if the elderly person is selected, the gain is changed in accordance with increase in the sound volume set by the sound volume setting portion, in accordance with increase in the sound volume set by the sound volume setting portion.

6. A sound reproducing method executed by a sound reproducing apparatus that sets frequency characteristics of an input sound signal, and variably controls a sound volume when a sound signal is output as sound, wherein
    the method has a step that the sound reproducing apparatus changes frequency characteristics from frequency characteristics with a sound band including a band of human voice emphasized to frequency characteristics with gain characteristics corresponding to frequency gradually flattened in accordance with increase in the sound volume set at the time of sound output.

7. A sound reproducing method executed by a sound reproducing apparatus, comprising:
    extracting a common spectral component from a plurality of spectra respectively corresponding to a plurality of channels by applying a minimum function to the plurality of the spectra;
    subtracting the common spectral component from each of the plurality of spectra to extract a component other than the common spectral component for each of the plurality of the spectra;
    changing gains of the extracted common spectral component and the components other than the common spectral component to mix the components;
    variably controlling a sound volume when a sound signal is output as sound; and
    reducing the gain of the common spectral component in accordance with increase in the set sound volume.

8. A computer-readable non-transitory medium storing a program for implementing the functions of the sound reproducing apparatus as defined in any one of claims 1-3 and 4-5 by a computer.

* * * * *